US010128121B2

(12) United States Patent
Sasaki et al.

(10) Patent No.: US 10,128,121 B2
(45) Date of Patent: Nov. 13, 2018

(54) SUBSTRATE PROCESSING APPARATUS, SUBSTRATE PROCESSING METHOD AND SUBSTRATE PROCESSING PROGRAM

(71) Applicant: Tokyo Electron Limited, Tokyo (JP)

(72) Inventors: Mitsuru Sasaki, Miyagi (JP); Tatsuya Miura, Miyagi (JP); Toshihiro Ohno, Hokkaido (JP); Kazumune Ono, Miyagi (JP); Shoko Endo, Miyagi (JP); Ryu Kitahara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/304,570

(22) PCT Filed: May 18, 2015

(86) PCT No.: PCT/JP2015/064214
§ 371 (c)(1),
(2) Date: Oct. 17, 2016

(87) PCT Pub. No.: WO2015/178348
PCT Pub. Date: Nov. 26, 2015

(65) Prior Publication Data
US 2017/0040177 A1   Feb. 9, 2017

(30) Foreign Application Priority Data

May 20, 2014   (JP) ................. 2014-104206
Apr. 21, 2015  (JP) ................. 2015-087044

(51) Int. Cl.
*H01L 21/302*   (2006.01)
*H01L 21/3065*  (2006.01)
(Continued)

(52) U.S. Cl.
CPC .... *H01L 21/3065* (2013.01); *H01J 37/32926* (2013.01); *H01J 37/32935* (2013.01); *H01L 21/67011* (2013.01)

(58) Field of Classification Search
CPC .......... H01J 37/32926; H01J 37/32935; H01J 2237/3341; H01L 21/3065; H01L 21/67011; C23C 16/0245
(Continued)

(56) References Cited

U.S. PATENT DOCUMENTS 7,292,906 B2 * 11/2007 Funk ................. H01L 21/67253
257/E21.525
2008/0188970 A1   8/2008 Huang et al.
(Continued)

FOREIGN PATENT DOCUMENTS

JP   H09-082589    3/1997
JP   2007-266410   10/2007
(Continued)

*Primary Examiner* — Lan Vinh
(74) *Attorney, Agent, or Firm* — IPUSA, PLLC

(57) ABSTRACT

A substrate processing apparatus is provided that includes a control part configured to control a substrate process in accordance with a processing procedure set in a process recipe. The process recipe is linked to a plurality of partial recipes obtained by dividing the processing procedure into functions. The control part controls the substrate process in accordance with processing procedures set in the linked plurality of partial recipes.

8 Claims, 13 Drawing Sheets

(51) Int. Cl.
*H01J 37/32* (2006.01)
*H01L 21/67* (2006.01)

(58) Field of Classification Search
USPC ............ 156/345.24, 345.26, 345.27, 345.28; 438/706, 710, 714, 723
See application file for complete search history.

(56) References Cited

U.S. PATENT DOCUMENTS

2009/0120580 A1* 5/2009 Kagoshima ...... G05B 19/41875
156/345.24
2011/0194924 A1* 8/2011 Kobayashi ........ H01L 21/67017
414/805

FOREIGN PATENT DOCUMENTS

| JP | 2009-054674 | 3/2009 |
| JP | 2010-505209 | 2/2010 |
| WO | 2008/039940 | 4/2008 |

* cited by examiner

FIG.3

| RECIPE SETTING ITEM | T1 SETTING VALUE | T2 SETTING VALUE |
|---|---|---|
| COMMENTS | | |
| END-OF-STEP CONDITION | | |
| TOLERANCE CONDITION NO. | | |
| STEP PROCESSING TIME | | |
| ADDITIONAL PROCESS TIME DURING RECOVERY | | |
| STEP LOWER LIMIT TIME | | |
| CHAMBER PRESSURE | T1 PRESSURE | T2 PRESSURE |
| UPPER PART RF H. F. POWER | T1 UPPER PART POWER | T2 UPPER PART POWER |
| LOWER PART RF H. F. POWER | T1 LOWER PART POWER | T2 LOWER PART POWER |
| LOWER PART RF L. F. POWER | | |
| IGNITION STEP DELAY TIME | | |
| IGNITION STEP UPPER H. F. POWER | | |
| IGNITION STEP LOWER H. F. POWER | | |
| IGNITION STEP LOWER L. F. POWER | | |
| WAFER COOLING | | |
| EDGE COOLING PRESSURE | | |
| CENTER COOLING PRESSURE | | |
| GAS #1 FLOW RATE | | |
| GAS #2 FLOW RATE | | |
| GAS #3 FLOW RATE | | |
| GAS #4 FLOW RATE | | |
| GAS #5 FLOW RATE | | |
| GAS #6 FLOW RATE | | |
| GAS #7 FLOW RATE | | |
| GAS #8 FLOW RATE | | |
| GAS CONTROL METHOD | | |
| GAS CENTER FLOW RATE | | |
| ADDITIVE GAS FIRST OUT PROCESS | | |
| ATTRACTION ELIMINATION VOLTAGE | | |

T1 RECIPE → T1 SETTING VALUE column
T2 RECIPE → T2 SETTING VALUE column

FIG.4

| STEP | T1 (BACK SURFACE VACUUMING) CONTROL EXAMPLE |
|------|---------------------------------------------|
| S1 | MATCHER CHARGING PREVENTION RELAY CONTROL |
| S2 | EPD TERMINATION REQUEST TRANSMISSION |
| S3 | UPPER PART HV POWER OFF |
| S4 | UPPER PART HV RELAY OFF |
| S5 | PROCESS GAS OFF |
| S6 | N₂ ON |
| S7 | PRESSURE CONTROL START [T1 PRESSURE] |
| S8 | LOWER PART RF ON [T1 LOWER PART POWER] |
| S9 | UPPER PART RF ON [T1 UPPER PART POWER] |
| S10 | LOWER PART GAP HOME POSITION MOVED |
| S11 | LOWER PART ELECTRODE TEMPERATURE SET |
| S12 | WAFER BACK SURFACE VACUUMING START |
| S13 | RF POWER SUPPLY SEQUENCE DURING WAFER STATIC ELIMINATION |
| S14 | ATTRACTION (VACUUMING) STEP TIME MONITORING START |
| S15 | WAFER BACK SURFACE VACUUMING START |
| S16 | WAITING FOR LOWER PART GAP DRIVE COMPLETION |

| STEP | T2 (CHUCK OFF) CONTROL EXAMPLE |
|------|---------------------------------|
| S21 | RF POWER SUPPLY SEQUENCE DURING WAFER STATIC ELIMINATION |
| S22 | WAFER BACK SURFACE VACUUMING OFF |
| S23 | LOWER PART RF ON [T2 LOWER PART POWER] |
| S24 | UPPER PART RF ON [T2 UPPER PART POWER] |
| S25 | ATTRACTION (CHUCK OFF) STEP TIME MONITORING START |
| S26 | HV REVERSE APPLICATION START |
| S27 | DELAY |
| S28 | INTER LOCK CHECK |
| S29 | CONFIRMING END OF ATTRACTION (CHUCK OFF) STEP |
| S30 | WAFER BACK SURFACE VACUUMING OFF |

FIG.10

| AUTOMATIC CHECKING ITEM |
|---|
| CHAMBER'S VIRTUAL VOLUME MEASUREMENT |
| ZERO POINT PRESSURE CHECK |
| ZERO POINT ADJUSTMENT |
| SENSITIVITY / LINEARITY |
| ZERO POINT FLOW RATE CHECK |
| ZERO POINT ADJUSTMENT |
| FLOW RATE / STABILITY |
| FLOW RATE VALUE CHECK |
| FLOW RATE VALUE LEAK TEST |
| FLOW RATE VALUE $N_2$ PURGE |
| FLOW SPLITTER ZERO POINT CHECK |
| FLOW SPLITTER ZERO POINT ADJUSTMENT |
| FLOW SPLITTER STABILITY CHECK |
| EXTERNAL VOLUME MEASUREMENT |
| FLOW RATE SELF-DIAGNOSIS |
| ZERO POINT PRESSURE CHECK |
| ZERO POINT ADJUSTMENT |
| PUMP ABILITY CHECK |
| LEAK CHECK |
| ATTAINMENT OF PRESSURE |
| NPPC PCV ADJUSTMENT |
| LOWER PART TEMPERATURE SENSOR CHECK |
| LOWER PART TEMPERATURE UP AND DOWN TIME CHECK |
| DEPOSITION ATTACHMENT CHECK |

FIG.12

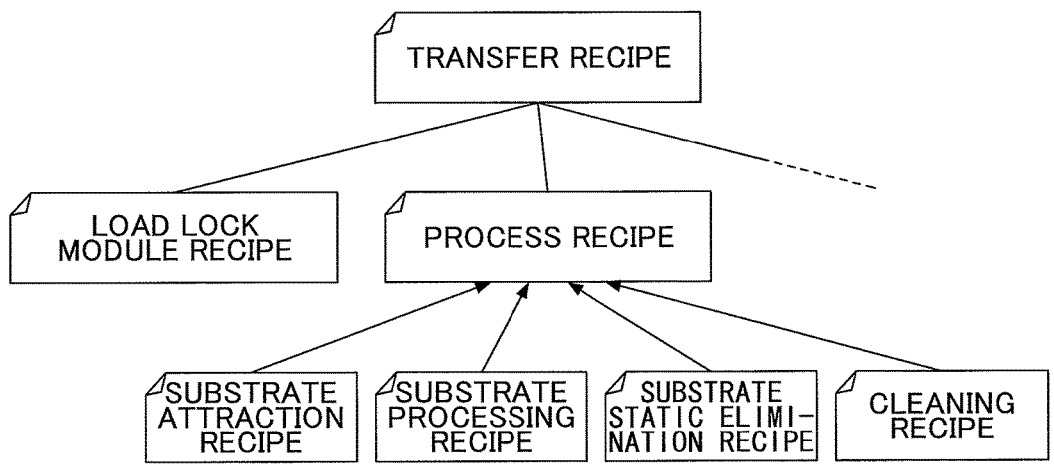

FIG.13

| RECIPE TYPE | | MASS PRODUCTION PROCESS | | DESIGN PROCESS | |
|---|---|---|---|---|---|
| MAIN RECIPE | PARTIAL RECIPE | REFERENCE AUTHORITY | EDITING AUTHORITY | REFERENCE AUTHORITY | EDITING AUTHORITY |
| TRANSFER RECIPE | ABSENT | PRESENT | PRESENT | PRESENT | PRESENT |
| LOAD LOCK MODULE RECIPE | ABSENT | PRESENT | PRESENT | PRESENT | PRESENT |
| PROCESS RECIPE | PRESENT (BELOW) | PRESENT | PRESENT | PRESENT | PRESENT |
| | SUBSTRATE ATTRACTION RECIPE | PRESENT / ABSENT (SELECTABLE) | ABSENT | PRESENT | PRESENT |
| | SUBSTRATE PROCESSING RECIPE | PRESENT / ABSENT (SELECTABLE) | ABSENT | PRESENT | PRESENT |
| | SUBSTRATE STATIC ELIMI- NATION RECIPE | PRESENT / ABSENT (SELECTABLE) | ABSENT | PRESENT | PRESENT |
| | CLEANING RECIPE | PRESENT / ABSENT (SELECTABLE) | ABSENT | PRESENT | PRESENT |

SUBSTRATE PROCESSING APPARATUS, SUBSTRATE PROCESSING METHOD AND SUBSTRATE PROCESSING PROGRAM

TECHNICAL FIELD

The present invention relates to a substrate processing apparatus, a substrate processing method and a substrate processing program.

BACKGROUND ART

Substrate processing apparatuses process substrates according to processing procedures specified in process recipes. Process conditions such as a pressure in processing a substrate, a sequence of the process and a timing of the process are set in the processing procedure specified in the process recipe (for example, see Patent Document 1). As to a variety of substrate processes implemented by the substrate processing apparatus, one process recipe is created for one process.

PRIOR ART DOCUMENTS

Patent Documents

Patent Document 1: Japanese Laid-Open Patent Application Publication No. 2007-266410

SUMMARY OF THE INVENTION

Problem to be Solved by the Invention

However, when all of the processing procedures of a preceding process, a substrate processing process and a post-process for processing the substrate are set in a single recipe, an input and a change of a setting value have to be performed for each process recipe although the processing procedure of the preceding process and the post-process can be commonly utilized in a plurality of processes. Hence, a load of an operator is great when inputting to or changing the recipe, and an error is likely to occur.

For example, a process condition of a static elimination process of the substrate that is one of the post-processes varies depending on a hardware configuration of a substrate processing apparatus. Accordingly, when the hardware configuration of the substrate processing apparatus is changed, setting values of all static elimination processes of a plurality process recipes need to be changed depending on the changed apparatus configuration, which takes a lot of time, thereby increasing the load of the operator.

In contrast, by setting an apparatus parameter, a value of the apparatus parameter can be reflected in all of the substrate processes performed by the substrate processing apparatus to which the apparatus parameter is applied. However, because the apparatus parameter is applied to all of the substrate process performed by the same substrate processing apparatus in a single uniform way, it is difficult to set different process conditions for a plurality of different processes performed by the same substrate processing apparatus.

In response to the above issues, according to an aspect, it is intended to make it easy to set, change and manage a process recipe.

Means for Solving the Problem

According to an embodiment of the present invention, there is provided a substrate processing apparatus that includes a control part configured to control a substrate process in accordance with a processing procedure set in a process recipe. The process recipe is linked to a plurality of partial recipes obtained by dividing the processing procedure into functions. The control part controls the substrate process in accordance with processing procedures set in the linked plurality of partial recipes.

Advantageous Effect of the Invention

According to an embodiment of the present invention, setting, changing and managing a process recipe can be made easy.

BRIEF DESCRIPTION OF THE DRAWINGS

FIG. 3 is a diagram illustrating an example of a T1 recipe and a T2 recipe according to an embodiment;

FIG. 4 is a diagram illustrating a sequence of a static elimination process according to an embodiment;

FIG. 10 is a diagram illustrating an example of automatic checking items according to an embodiment;

FIG. 12 is a diagram illustrating an example of a recipe configuration according to a modified example of an embodiment;

FIG. 13 is a diagram illustrating an example of authority according to a modified example of an embodiment;

EMBODIMENTS FOR IMPLEMENTING THE INVENTION

Figure 1:
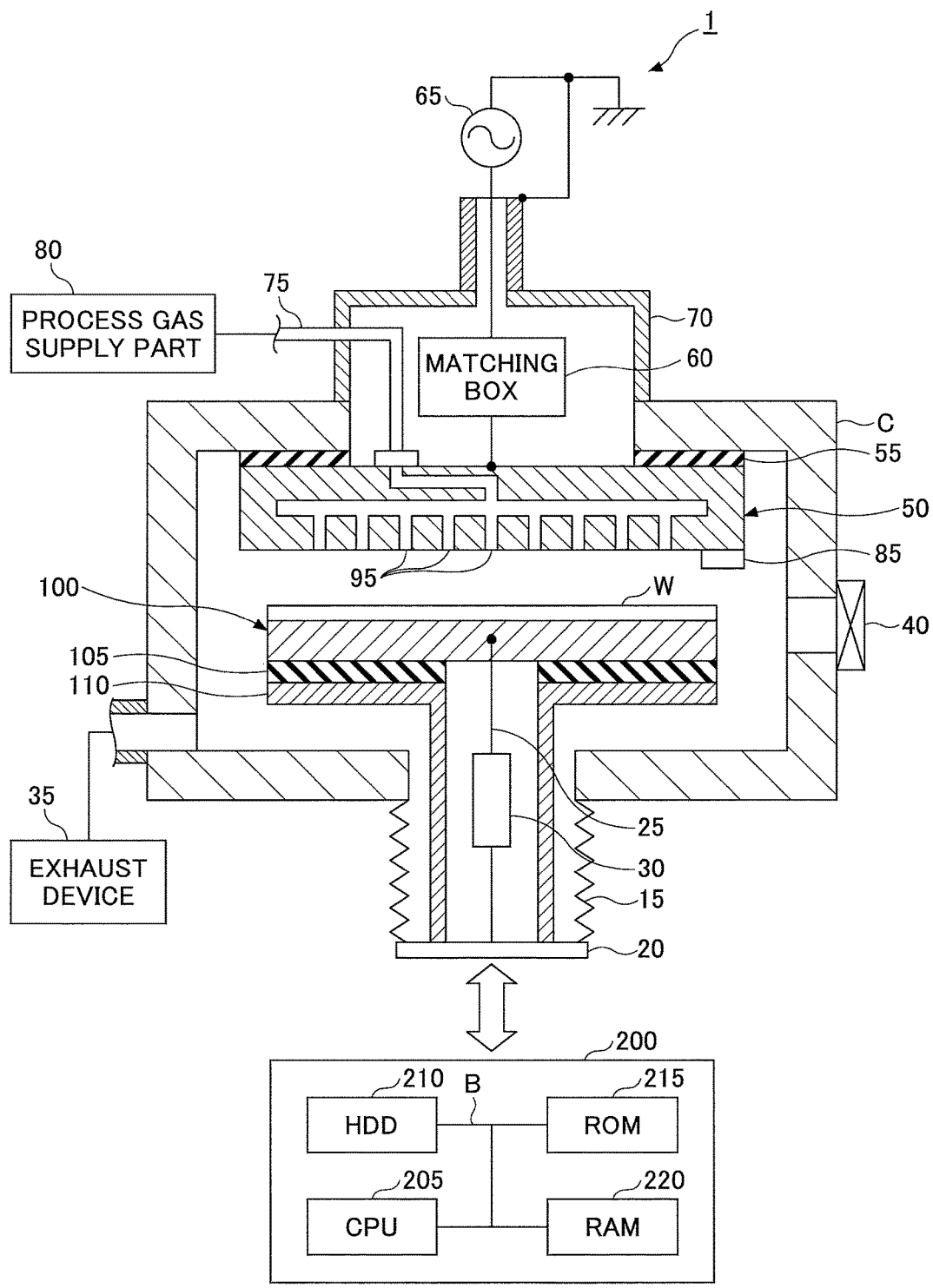
FIG. 1 is a diagram illustrating an example of an overall configuration of a substrate processing apparatus according to an embodiment.

In the following, embodiments of the present invention are described with reference to the accompanying drawings. Note that elements having substantially the same functions or features may be given the same reference numerals and overlapping descriptions thereof may be omitted.

[Overall Configuration of Substrate Processing Apparatus]

To begin with, an example of an overall configuration of a substrate processing apparatus 1 according to an embodiment of the present invention is described below with reference to FIG. 1. FIG. 1 illustrates an example of the substrate processing apparatus 1 according to an embodiment.

The substrate processing apparatus 1 includes a cylindrical chamber 10. The chamber C is made of, for example, aluminum whose surface is anodized. A lower electrode 100 that also serves as a pedestal on which a substrate is placed is provided in the chamber C. The lower electrode 100 is supported by a support 110 provided via an insulating material.

An upper electrode 50 is provided at a ceiling part of the chamber C. The upper electrode 50 is electrically insulated from the chamber C by an insulating material 55 disposed at the ceiling part of the chamber C. A high frequency power source 65 is connected to the upper electrode 50 via a matching circuit 60. Here, the high frequency power source 65 may be connected to the lower electrode 100 instead of being connected to the upper electrode 50. Moreover, two high frequency power sources may be connected to the upper electrode and the lower electrode. Two high frequency power sources may be connected to the lower electrode together. The matching circuit 60 is provided in a matching box 70. The matching box 70 serves as a grounded housing of the matching circuit 60.

A process gas supply part 80 is connected to the upper electrode 50 via a gas supply passage 75. A desired gas output from the process gas supply part 80 passes through the gas supply passage 75 and the upper electrode 50, and is supplied into the chamber C from a plurality of gas discharge holes 95. Thus, the upper electrode 50 also functions as a gas shower head. A temperature sensor 85 is provided at the upper electrode 50. The temperature sensor 85 detects an internal temperature of the chamber C.

Bellows 15 are attached to an opening in a central location of a bottom part of the chamber C. The bellows 15 are foxed to an elevating plate 20. The elevating plate 20 adjusts a height at which a substrate W is placed by elevation. An impedance adjustment part 30 is connected between the lower electrode 100 and the elevation plate 20 via an electrically conducting path 25.

The pressure inside the chamber C is reduced to a desired degree of vacuum by an exhaust device 35. The substrate W is carried into the chamber C from a gate valve 40. A gas and high frequency power are supplied into the chamber C, thereby performing a desired etching on the substrate W by action of plasma generated from the gas.

A control part 200 includes a CPU (Central Processing Unit) 205, an HDD (Hard Disk Drive) 210, a ROM (Read Only Memory) 215, and a RAM (Random Access Memory) 220. The CPU 205, the HDD 210, the ROM 215 and the RAM 220 are connected with each other through a bus B. The control part 200 performs a predetermined process on the substrate W in accordance with a processing procedure specified in the process recipe.

The process recipe is stored in the HDD 210 or the RAM 220. Process conditions, a sequence of the process and a timing of the process are set in the process recipe as the processing procedure of the substrate. Values of process time, temperatures inside the chamber C (upper electrode temperature, side wall temperature of the process chamber), a pressure (emission of the gas), the high frequency power of voltage, flow rates of various gases and the like are set in the process conditions. For example, the control part 200 adjusts the temperature inside the chamber C by comparing the setting temperature of the recipe to a detected temperature. Actual control is performed by the CPU 205. The CPU 205 performs a process such as an etching process on the substrate in accordance with the process recipe. Here, the function of the control part 200 may be implemented by software or hardware. Hereinabove, the overall configuration of the substrate processing apparatus 1 according to the present embodiment has been described.

[Configuration of Process Recipe]

Figure 2:
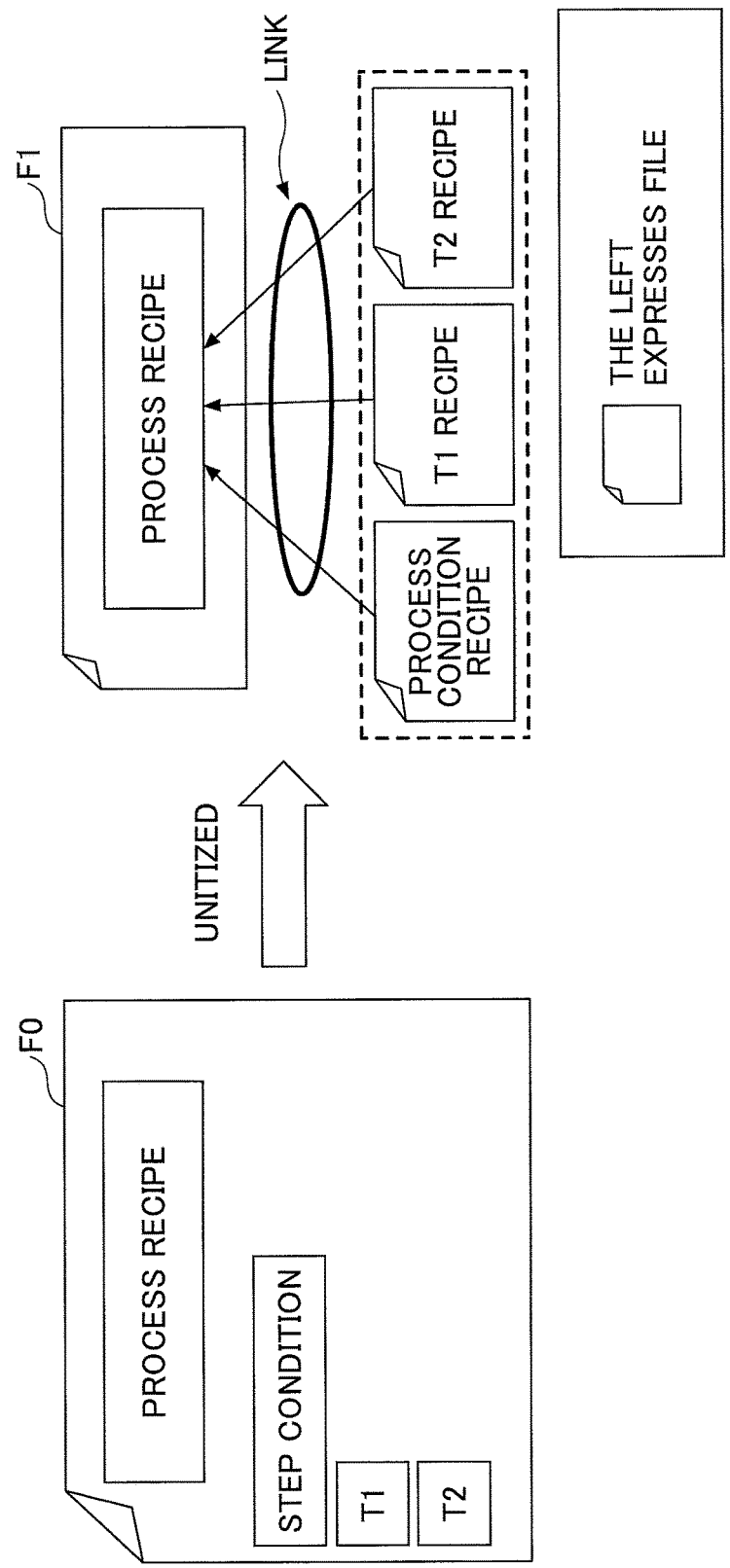
FIG. 2 is a diagram illustrating an example of a configuration of a process recipe according to an embodiment.

Next, an example of the process recipe according to the present embodiment is described below with reference to FIG. 2. On the right side of FIG. 2, an example of a configuration of a process recipe according to the present embodiment is illustrated. On the left side of FIG. 2, one process recipe is created for one substrate process. An example in which step conditions of a main process for processing a substrate and all processing procedures of a static elimination process T1 and T2 of the post-process are set in the process recipe in a file F0, is illustrated.

In the file F0, the step conditions and all of the processing procedures of the static elimination process T1 and T2 are set in the process recipe. Hence, even the setting values for a common process such as the static elimination process T1 and T2 need to be changed for each process recipe, which generates many locations to be changed and makes the load of operator greater. Moreover, an inputting error when changing the setting is likely to occur.

In contrast, in the present embodiment, the processing procedure set in one process recipe is divided into functions and are unitized. In the present embodiment, each of the unitized recipes is referred to as a "partial recipe." On the right side of FIG. 2, the partial recipes of a process condition recipe, a T1 recipe and a T2 recipe are illustrated as an example of a plurality of partial recipes obtained by dividing the processing procedure into functions and then being unitized.

The process recipe in the file F1 of the present embodiment is linked to each of the partial process recipes of the process condition recipe, the T1 recipe and the T2 recipe. The process recipe provides a link to the process condition recipe, the T1 recipe and the T2 recipe so that the processing procedures are performed in the order of the process condition recipe, the T1 recipe and the T2 recipe. By doing this, the control part 200 refers to the processing procedure set in the process condition recipe and the processing procedures set in the T1 recipe and the T2 recipe in sequence, and the predetermined process is performed on the substrate W.

Here, the process condition recipe is an example of a partial recipe setting a processing procedure unique to the substrate process. The T1 recipe and the T2 recipe are examples of partial recipes setting processing procedures common to the substrate process.

The partial recipe setting the unique processing procedure is a recipe that sets process conditions unique to a substrate process such as an etching process and a film deposition process, a sequence of the process, and a timing of the process. A type or a flow rate of an etching gas, a pressure inside the chamber C, and a temperature inside the chamber C are cited as the unique process conditions.

The partial recipe setting the common processing procedure is a recipe that sets process conditions, a sequence of the process and a timing of the process of a preceding process or a post-process of the substrate process (main process) such as the etching. Seasoning for preparing conditions within the chamber before processing the substrate and an attraction process for attracting the substrate on the pedestal are cited as examples of the preceding process. A static elimination process for separating the substrate from the pedestal and a cleaning process that cleans the inside of the chamber C are cited as examples of the post-process.

For example, FIG. 3 illustrates examples of recipes of the static elimination processes T1 and T2 (T1 recipe and T2 recipe) that are examples of the post-process. In FIG. 3, T1 setting values (T1 recipe) and T2 setting values (T2 recipe) corresponding to recipe setting items are illustrated. FIG. 3 illustrates the T1 and T2 setting values of items of a chamber pressure and high frequency power of an upper part RF and a lower part RF, respectively, and omits the other T1 and T2 setting values for the purpose of illustration.

An example of a sequence of the static elimination process is illustrated in FIG. 4. The left side of FIG. 4 illustrates an example of control of the T1 (back surface vacuuming) static elimination process, and the right side of FIG. 4 illustrates an example of control of the T2 (chuck off) static elimination process.

For example, the T1 pressure set in the T1 recipe is set at a timing of a start of a pressure control of step S7 of the control example of the T1 static elimination process illustrated on the left side of FIG. 4, and the T1 lower part power and the T1 upper part power set in the T1 recipe are set at timings of steps S8 and S9. Moreover, the T2 lower part power and the T2 upper part power set in the T2 recipe are set at timings of steps S23 and S24 of the example of control of the T2 static elimination process illustrated on the right side of FIG. 4.

In this manner, in the creation of the process recipe according to the present embodiment, the T1 recipe and the T2 recipe of the static elimination process setting the common processing procedure are partial recipes different from the process condition recipe (partial recipe) setting the unique processing procedure, both of which are managed separately from each other. Thus, when the setting value of the T1 recipe or the T2 recipe setting the common processing procedure varies, the setting value of the T1 recipe or the T2 recipe just has to be changed. This allows an operator to reduce time and effort when setting or changing the recipe, thereby reducing an inputting error. This makes it possible to facilitate setting, changing and managing the process recipe.

Thus, the process recipe according to the present embodiment is linked to the process condition recipe setting the processing procedure unique to the substrate process, and the T1 recipe and the T2 recipe setting the processing procedure common to the substrate process. By doing this, the control part 200 can execute the processing procedure of the process recipe by combining the plurality of partial recipes. For example, in the process recipe according to the present embodiment, modification of the processing procedure and reuse of the partial recipe can be flexibly performed by exchanging a part or the whole of the partial recipe, deleting a part of the partial recipe and changing the combination of the partial recipes. Thus, creating the process recipe or changing the setting of the process recipe can be efficiently performed. In particular, in the process recipe according to the present embodiment, because the process common to the recipes is unitized, the partial recipe of the common process can be managed as one unit. Thus, by changing the partial recipe in which the common process is unitized, the change can be applied to a plurality of process recipes that refer to the partial recipe. Thus, the operation of setting the recipe and changing the setting can be efficiently performed.

[Example of Processing Substrate]

Figure 5:
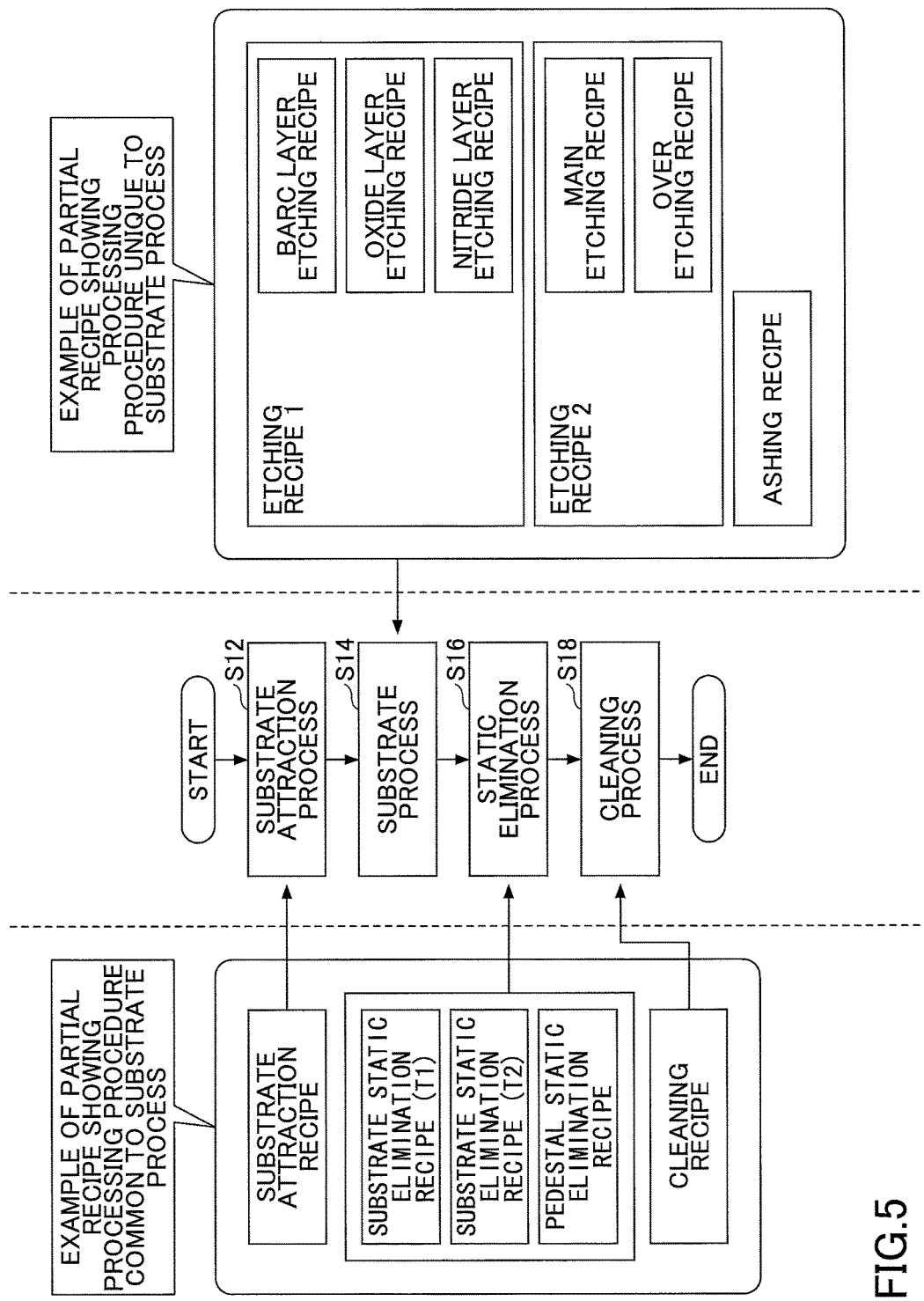
FIG. 5 is a flowchart illustrating an example of a substrate process according to an embodiment.

Next, an example of processing a substrate according to the present embodiment is described below with reference to FIG. 5. FIG. 5 is a flowchart illustrating the example of processing the substrate according to the present embodiment. When a substrate is carried into the chamber C, the control part 200 applies a direct current voltage to electrodes of the electrostatic chuck that are not illustrated in the drawings and performs a process for electrostatically attracting the substrate to the pedestal (lower electrode 100) (step S12). Next, the control unit 200 performs a predetermined process such as an etching on the substrate (step S14). Subsequently, the control part 200 removes electric charge by applying a direct current voltage that has opposite positive and negative signs to the direct current voltage that is applied in step S12, and separates the substrate from the pedestal (step S16). The control part 200 carries the substrate out of the chamber C, performs a process of cleaning the inside of the chamber C (step S18), and ends the present process.

The process recipe according to the present embodiment has link information to the plurality of partial recipes obtained by dividing the processing procedure into functions and being unitized. The control part 200 refers to the partial recipe that the link represents, and controls the substrate process in accordance with the processing procedure set by the partial recipe that the link represents. Thus, the desired process is performed on the substrate.

The plurality of partial recipes includes the partial recipe setting the processing procedure unique to the substrate process and the partial recipe setting the processing procedure common to the substrate process. An example of the partial recipe setting a processing procedure unique to a process of a substrate W is illustrated on the right side of FIG. 5. For example, when the substrate process is performed in the order of the etching process and the ashing process in step S14, etching recipes 1 and 2 and an ashing recipe are cited as examples of the partial recipes setting the unique processing procedure linked to the process recipe.

When the processing procedure unique to the substrate process is divided into a plurality of processes, the partial recipe setting the processing procedure unique to the substrate process may contain a plurality of partial recipes that set a processing procedure of each of the processes. For example, the etching recipe 1 can be broken down by function and divided into a plurality of partial recipes. When the etching recipe 1 is a recipe setting a processing procedure of etching a laminated film, process conditions in etching each layer differ from each other. Hence, the etching recipe 1 can be divided into a BARC layer etching recipe, an oxide layer etching recipe and a nitride layer etching recipe. The process recipe according to the present embodiment has each of pieces of link information of the BARC layer etching recipe, the oxide layer etching recipe and the nitride layer etching recipe, which makes it possible to refer to each of the partial recipes.

Moreover, in an etching of a hole, process conditions of a main etching and an over etching differ from each other. Hence, as illustrated in FIG. 5, the etching recipe 2 can be divided into partial recipes of the main etching recipe and the over etching recipe. Furthermore, although not illustrated in the drawings, when the main etching process is divided into a plurality of processes including an etching process of an oxide film and an etching process of a polysilicon film, the main etching recipe can be further divided into an etching recipe for an oxide film and an etching recipe for a polysilicon film.

The partial recipe setting the processing procedure common to the substrate process contains a partial recipe setting at least any of the processing procedures of the preceding process and the post-process of the process unique to the substrate process. An example of a partial recipe setting a processing procedure common to a process of a substrate W is illustrated on the left side of FIG. 5. For example, a substrate attraction recipe setting the processing procedure of the substrate attraction process of step S12 that is the preceding process of the process of step S14 in which the unique process is performed, is an example of the partial recipe setting the processing procedure common to the substrate process.

The static elimination recipes T1 and T2 for the substrate setting the processing procedure of the substrate static elimination process of step S16 and the static elimination recipe for the pedestal are cited as other examples of the partial recipe setting the processing procedure common to the substrate process. A cleaning recipe setting the cleaning process of step S18 is cited as another example of the partial recipe setting the processing procedure common to the substrate process.

[Process Recipe Configuration Example 1]

Figure 6:
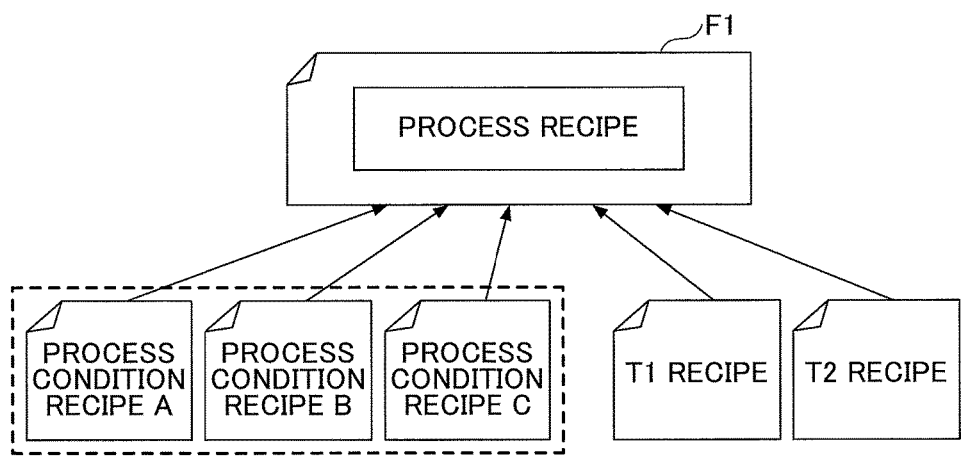
FIG. 6 is a diagram illustrating a configuration example 1 of a process recipe according to an embodiment.

As illustrated in FIG. 6, the process recipe can be linked to a plurality of process condition recipes A, B and C as partial recipes setting the processing procedures unique to the substrate process. For example, when the etching processes of the BARC layer, the oxide layer and the nitride layer formed on the substrate by the flowchart illustrated in FIG. 5 are performed, the process condition recipe A is a BARC layer etching recipe; the process condition B is an oxide layer etching recipe; and the process condition C is a nitride layer etching recipe.

In FIG. 6, the process recipe is linked to the T1 recipe and the T2 recipe of the post-process as the partial recipes setting the process common to the process of the substrate W. Although not illustrated in FIG. 6, the process recipe may be linked to the substrate attraction recipe of the preceding process or the cleaning recipe of the post-process as the partial recipe setting the process common to the substrate process. Thus, the process recipe can be linked to one or more partial recipes setting the process unique to the substrate process and one or more partial recipes setting the process common to the substrate process.

[Process Recipe Configuration Example 2]

Figure 7:
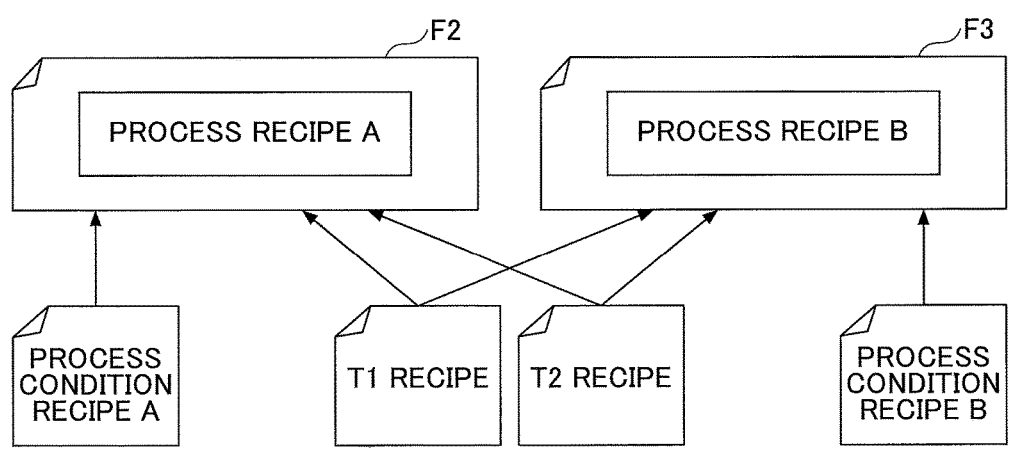
FIG. 7 is a diagram illustrating a configuration example 2 of a process recipe according to an embodiment.

As illustrated in FIG. 7, a unitized plurality of partial recipes can be specified by a plurality of process recipes and can be commonly used. In FIG. 7, the process condition recipe A in a file F2 and the process condition recipe B in a file F3 are linked to the T1 recipe and the T2 recipe. Thus, the T1 recipe and the T2 recipe can be referred to by the process condition recipe A and the process condition recipe B, and the processing procedures set in the T1 recipe and the T2 recipe can be utilized by the process condition recipe A and the process condition recipe B. By doing this, time and effort to define each of the processing procedures set in the T1 recipe and the T2 recipe for each process recipe can be saved.

For example, when the process condition recipe A is the etching recipe for the oxide film and the process condition recipe B is the etching recipe for the polysilicon film, and if the processing procedure of the etching of the oxide film is desired to be changed, only the process condition recipe A just has to be changed. If the processing procedure of the etching of the polysilicon film is desired to be changed, only the process condition recipe B just has to be changed. When the processing procedures of the static elimination process is desired to be changed, only the T1 and T2 recipes just have to be changed. Thus, according to the present embodiment, because the setting, the change of the setting and the management of the recipe can be performed by a unit of the partial recipe unitized by functions, time and effort of an inputting operation can be saved and the recipe management can be efficiently performed.

[Process Recipe Configuration Example 3]

Figure 8:
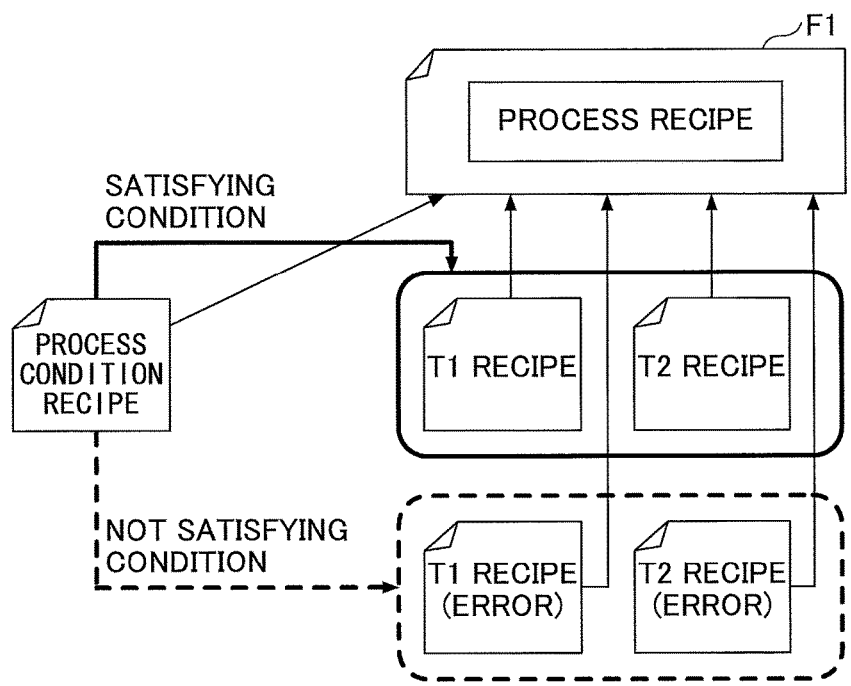
FIG. 8 is a diagram illustrating a configuration example 3 of a process recipe according to an embodiment.

The partial recipe may contain a recipe setting a processing procedure of an error process. As illustrated in FIG. 8, the process recipe in the file F1 may not only perform the processing procedures set in the plurality of process recipes but also contain processing procedures that branch off depending on a predetermined condition. Here, when a branched process is performed in the processing procedure specified in the process condition recipe, if the predetermined condition is not satisfied, processing procedures in the case of error in the static elimination process set in the T1 recipe (error process) and the T2 recipe (error process) are performed. On this occasion, the processing procedures in normal time in the static elimination process set in the T1 recipe and the T2 recipe are not performed.

In contrast, when the predetermined condition is satisfied, the processing procedures in the normal time in the static elimination process set in the T1 recipe and the T2 recipe are performed, and the processing procedures in the case of error in the static elimination process set in the T1 recipe (error process) and the T2 recipe (error process) are not performed. Thus, the partial recipe corresponding to the predetermined condition can be referred to.

[Process Configuration Recipe 4]

Figure 9:
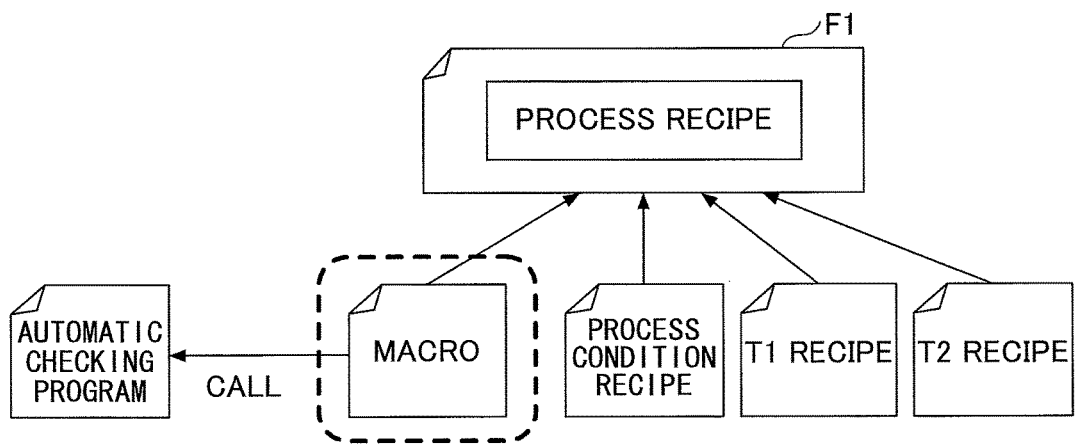
FIG. 9 is a diagram illustrating a configuration example 4 of a process recipe according to an embodiment.

Moreover, as illustrated in FIG. 9, the process recipe in the file F1 may be linked not only to the process condition recipe, the T1 recipe and the T2 recipe but also to a macro program (which is also referred to as a "macro" hereinafter). On this occasion, the control part 200 controls the substrate process in accordance with a sequence determined by the linked macro.

This allows the cleaning process or a checking process to be readily inserted by using the macro before and after the substrate process is performed. For example, a processing procedure of a relatively small processing unit such as a particle check and a setting of open and close of a valve can be set in the process recipe by using the macro.

For example, a NPPC (Non-Plasma Particle Cleaning) removes particles in the chamber C by intermittently applying a voltage to the inside of the chamber C from a direct current power source (not illustrated in the drawings) while supplying and evacuating a purge gas into and from the chamber C due to an electromagnetic stress based on a physical vibration caused by an impulse wave of the purge gas or a potential gradient instantaneously formed in the wall surface of the apparatus and the pedestal. When the process of the NPPC is performed before processing the substrate, conditions of the NPPC may be set in the process recipe by using the macro. By causing the process recipe to be linked to the macro, the function of macro can be referred to from the process recipe.

In addition, for example, a confirmation test of whether or not the substrate processing apparatus normally operates can be performed by using the macro. According to this, a program to implement a function of the macro does not have to be separately created by using the macro, and reducing the operation and shortening a development period can be achieved.

Furthermore, as illustrated in FIG. 9, the process recipe in the file F1 may have be linked to a checking program by calling an automatic checking program through the macro. However, not limited to this, the process recipe may directly call the automatic checking program without calling though the macro. In this case, the control part 200 checks whether the substrate processing apparatus is in a normal state in accordance with checking items determined in the linked checking program.

Examples of items checked by the automatic checking program are illustrated in FIG. 10. In the automatic checking program, checking items such as an attainable pressure value or a leak value in the chamber C, a gas flow rate flowing into the chamber C, and an attachment state of particles (deposition) can be automatically checked.

Figure 11:
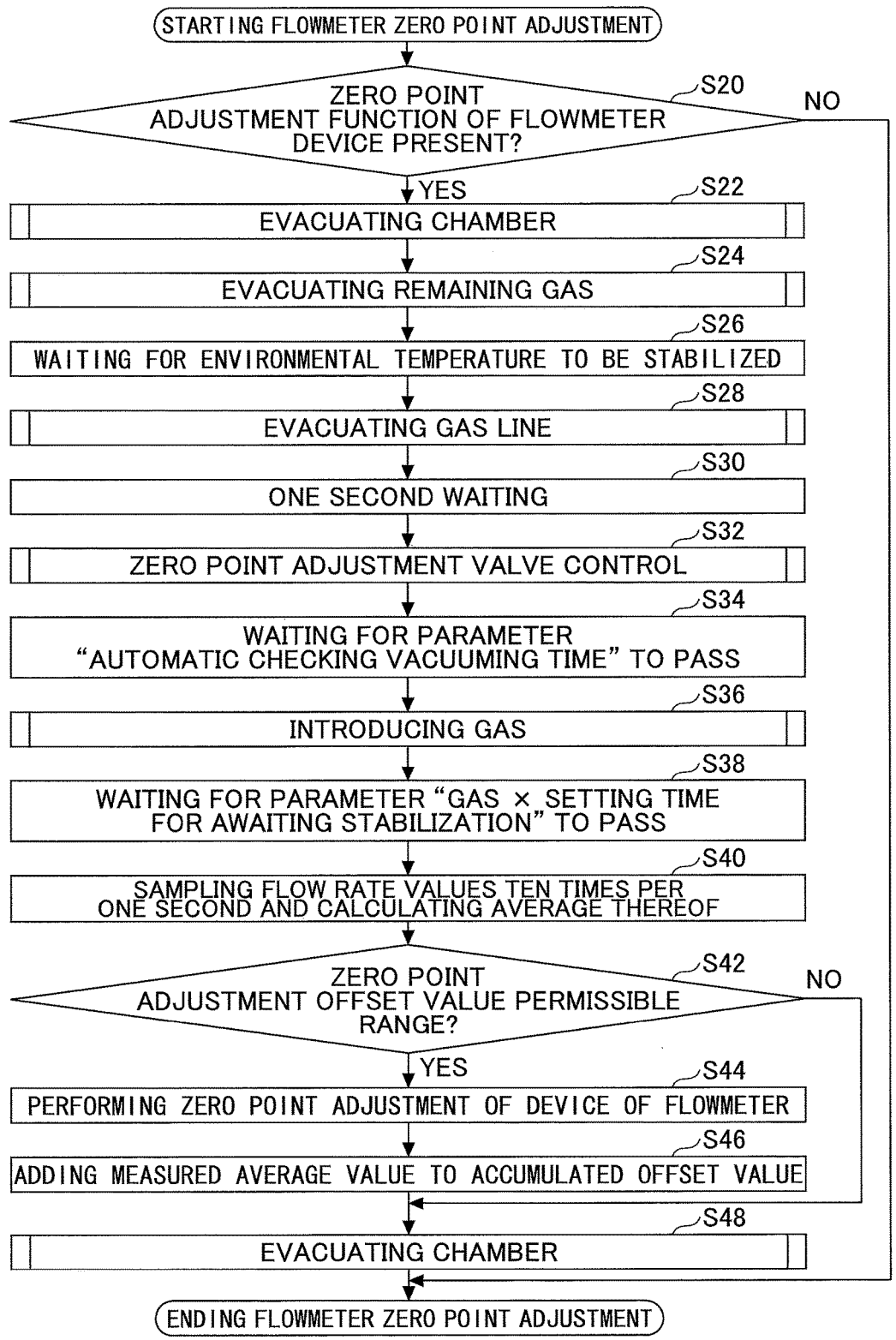
FIG. 11 is a diagram illustrating an example of a sequence of automatic check according to an embodiment.

For example, in an automatic checking sequence illustrated in FIG. 11, the macro to which the process recipe is linked starts the automatic checking program, thereby implementing a sequence check of zero point adjustment of a gas flowmeter illustrated at steps S20 through S48 of FIG. 11. A specific description of the processes from steps S20 to S48 is omitted. In the automatic checking sequence illustrated in FIG. 11, the automatic checking program may be directly started by the process recipe.

As described above, according to the configuration of the process recipe of the present embodiment, the partial recipe setting the common processing procedure (e.g., T1 and T2 recipes) and the partial recipe setting the unique processing procedure (e.g., process condition recipe) can be separately managed. Thus, when a change to the setting of each partial recipe is needed, only the setting of the partial recipe just has to be changed. In particular, the change of the partial recipe setting the common process is reflected in all of the process recipes that are linked to and refers to the partial recipe. Hence, the setting change of the common processing portion contained in the process recipe setting the whole processing procedure does not have to be made to all of the process recipes as done conventionally. Due to this, the time and effort of the operator can be saved by widely reducing a quantity of work for setting the recipe and changing the setting. Thus, setting, changing and managing the process recipe can be easily performed.

Moreover, according to the configuration of process recipe of the present embodiment, a function other than the recipe such as the macro and the automatic checking program can be linked. Thus, an operation other than the execution of the program using the recipe (operation using the macro or the automatic checking program) can be readily performed.

Modified Embodiment

Next, a modified embodiment of the present embodiment is described below with reference to FIGS. 12 through 15. In the modified embodiment of the present embodiment, the recipe, an edition of the setting item of the partial recipe and whether reference is authorized or not are controlled. FIG. 12 illustrates an example of the recipe and the partial recipe used for the description of the modified embodiment.

A transfer path in transferring the wafer W, a transfer timing and the like are set in a transfer recipe. The transfer recipe is liked to recipes such as a load lock module recipe and a process recipe. Carry-in/out of the wafer at the load lock module, timings of air supply and evacuation of air and the like are set in the load lock module recipe. In the modified embodiment, the process recipe is linked to each partial recipe of a substrate attraction recipe, a substrate processing recipe, a substrate static elimination recipe and a cleaning recipe. Conditions in attracting the wafer on the pedestal are set in the substrate attraction recipe. Process conditions in processing the wafer are set in the substrate processing recipe. Conditions in separating the wafer from the pedestal are set in the substrate static elimination recipe. Conditions in cleaning the inside of the chamber are set in the cleaning recipe.

In a mass production process and a design process, when each item of each of the above recipes is set or changed on a screen in a single uniform way, an erroneous change might be made to an item that does not need to be changed in any of the design process and the mass production process and might cause an operational error.

In particular, knowledge about an operation of the substrate processing apparatus 1 and substance of the recipe differs between the operator of the design process and the operator of the mass production process. Because of this, by displaying the same screen in the mass production process and the design process, an occurrence of the operational error is desired to be preliminarily prevented in operating the screen.

Therefore, in the present modified embodiment, the screen depending on a reference authority and an editorial authority is displayed in the mass production process and the design process, thereby decreasing the operational error. A manager may preliminarily set the reference authority and the editorial authority, and may change the setting during the operation. FIG. 13 illustrates an example of the reference authority and the editorial authority.

In a table setting the reference authority and the editorial authority illustrated in FIG. 13, whether reference is authorized or not and whether editing is authorized or not are set for each recipe by separating the main recipe from the partial recipe. The main recipe includes a transfer recipe, a load lock module recipe, and a process recipe. In the present example, the transfer recipe has reference authority and editorial authority in the mass production process and the design process. The load lock module recipe and the process recipe similarly have the reference authority and the editorial authority in the mass production process and the design process.

The substrate attraction recipe, the substrate processing recipe, the substrate static elimination recipe and the cleaning recipe are partial recipes linked to the process recipe. These partial recipes have the reference authority and the editorial authority in the design process. Moreover, these partial recipes do not have the editorial authority in the mass production process. Furthermore, these partial recipes can select the presence or absence of the reference authority in the mass production process.

The editorial authority set in each of the process recipe and the plurality of partial recipes is an example of first authority information showing an authority to edit each of the process recipe and the plurality of partial recipes. Moreover, the reference authority set in each of the process recipe and the plurality of partial recipes is an example of second authority information showing an authority to refer to each of the process recipe and the plurality of partial recipes.

The control part 200 controls whether editing is authorized or not on the screen of the process recipe and the plurality of partial recipes based on the authority to edit each of the process recipe and the plurality of partial recipes.

The control part 200 controls whether the reference is authorized or not on the screen of the process recipe and the plurality of partial recipes based on the authority to refer to each of the process recipe and the plurality of partial recipes.

For example, FIG. 14 illustrates an example of a screen when a manager selects the "present" in the reference authority of the mass production process with respect to the substrate attraction recipe, the substrate processing recipe, the substrate static elimination recipe and the cleaning recipe.

Figure 14A:
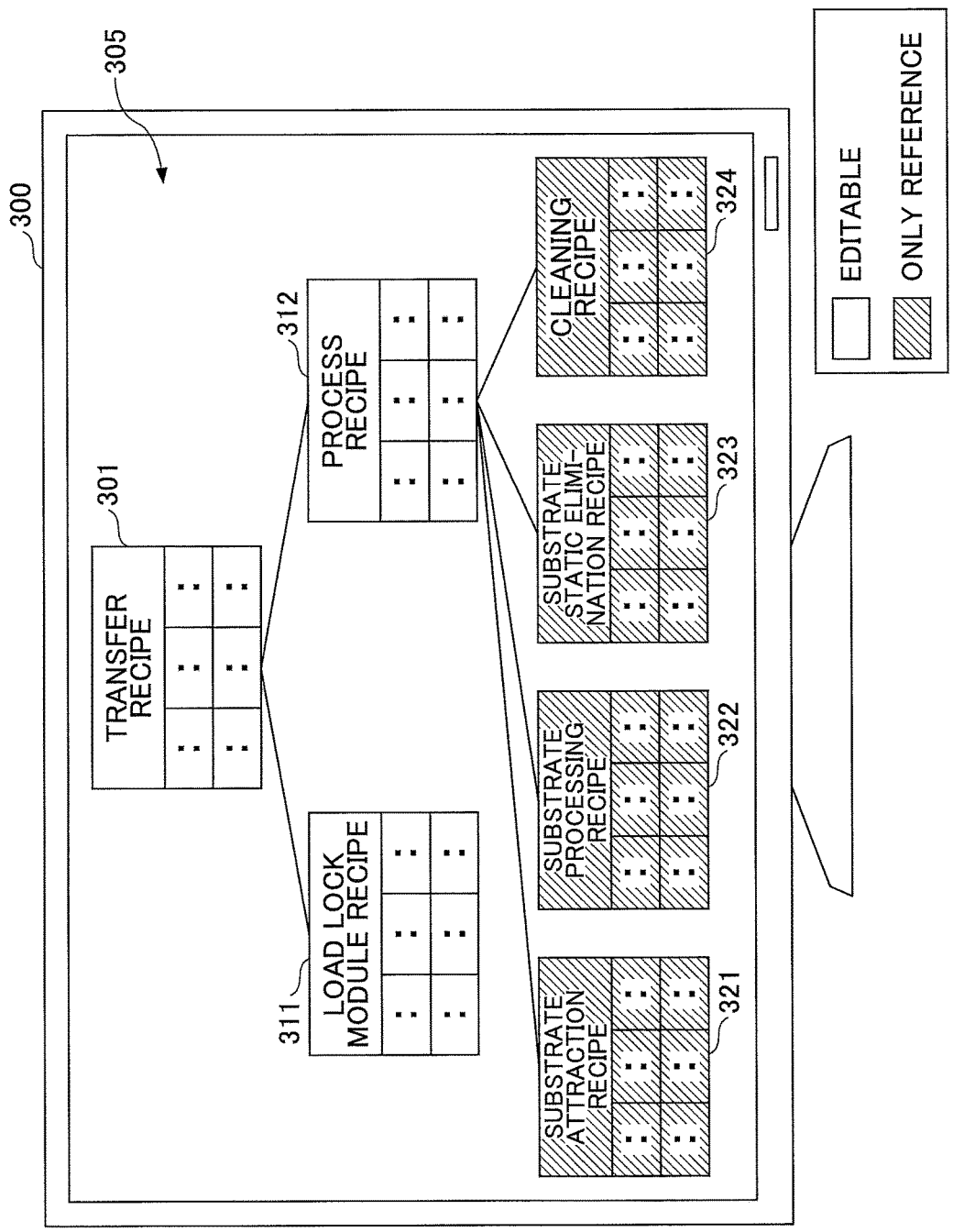
FIG. 14A is a diagram illustrating an example of a screen according to a modified example of an embodiment.
Figure 14B:
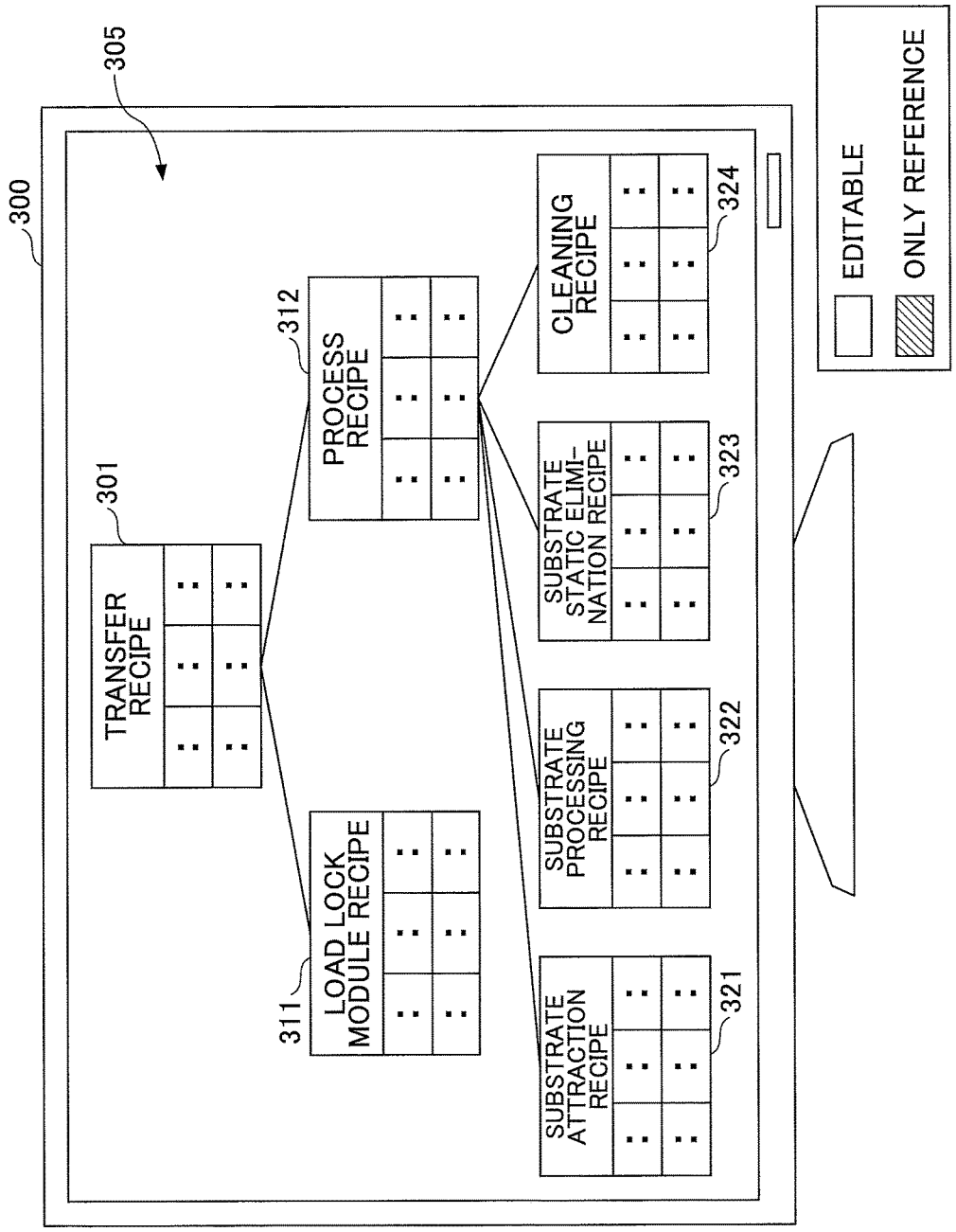
FIG. 14B is a diagram illustrating an example of a screen according to a modified example of an embodiment.

FIGS. 14A and 14B are examples of setting screens displayed on a display 305 of a PC 300 including the control part 200 of FIG. 1. FIG. 14A is an example of a setting screen in the mass production process, and FIG. 14B is an example of a setting screen in the design process. In the mass production process illustrated in FIG. 14A, a display area of the transfer recipe 301, a display area of the load lock module recipe 311 and a display area of the process recipe 312 are displayed so that items in each recipe are editable.

In contrast, a display area of the substrate attraction recipe 321, a display area of the substrate processing recipe 322, a display area of the substrate static elimination recipe 323 and a display area of the cleaning recipe 324 are displayed so that only the reference of items in each recipe can be performed (i.e., editing is not allowed).

According to this, a hierarchy editable by an operator can be divided into the main recipe and the partial recipe. In other words, the operator can edit each of the items of the transfer recipe, the load lock module recipe and the process recipe in the mass production process. On the other hand, the operator can only refer to the substrate attraction recipe, the substrate processing recipe the substrate static elimination recipe and the cleaning recipe, and cannot edit each item of these partial recipes.

FIG. 14B is an example of a setting screen in the design process. In the design process, all of the recipes and the partial recipes on the screen are editable.

Thus, while considering the knowledge of the operator of the design process and the operator of the mass production process, by limiting the editorial authority in the mass production process less than the editorial authority in the design process, the operational error of mistakenly changing the setting on the screen can be reduced.

Figure 15:
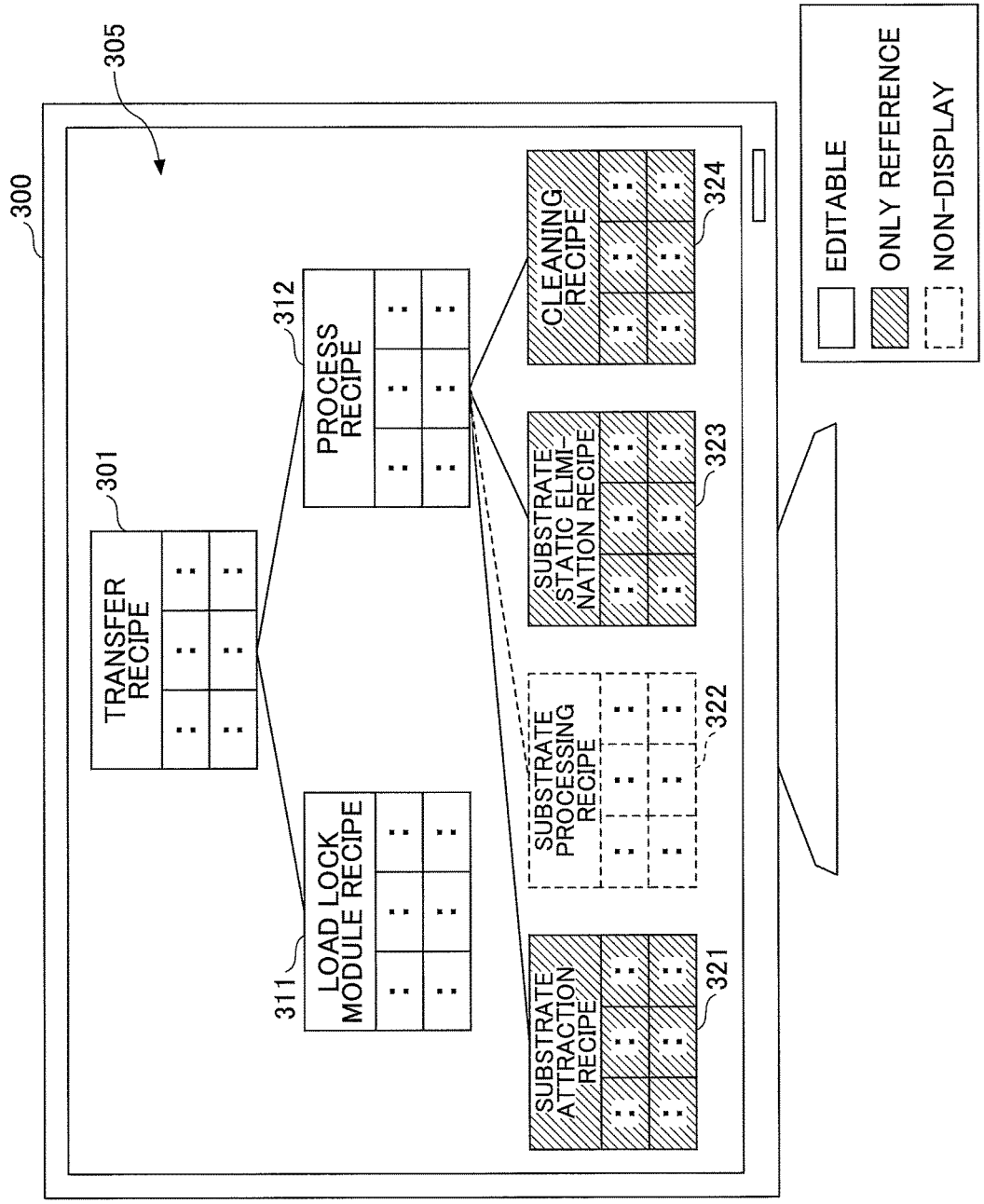
FIG. 15 is a diagram illustrating an example of a screen according to a modified example of an embodiment.

FIG. 15 illustrates another example of a setting screen of recipes displayed on the display 305. FIG. 15 differs from the setting screens illustrated in FIGS. 14A and 14B in that the substrate processing recipe 322 is not displayed in the mass production process. In this case, the reference authority of the substrate processing recipe illustrated in FIG. 13 is set at "absent" and the reference authority of the other partial recipes is set at "present." The display area of the substrate attraction recipe 321, the display area of the substrate static elimination recipe 323, the display area of the cleaning recipe 324 are displayed so that items of each recipe can be referred to but cannot be edited based on the above reference authority. The display area of the substrate processing recipe 322 is not displayed. Thus, the display on the display 305 can be controlled so that the process conditions of the substrate processing recipe cannot be referred to. Here, in this case, the same screen as FIG. 14B is displayed in the design process.

According to this, the operator can edit the transfer recipe, the load lock module recipe, and the process recipe in the mass production process. Moreover, the operator can refer to but cannot edit the substrate attraction recipe, the substrate static elimination recipe and the cleaning recipe. Furthermore, the operator cannot even refer to the substrate processing recipe. Thus, by limiting the editorial authority and the reference authority in the mass production process and the design process, the operational error of mistakenly changing the setting on the screen can be reduced, and a disclosure of information such as the process conditions can be limited.

As discussed above, although the embodiments of the substrate processing apparatus, the substrate processing method and the substrate processing program has been described, the present invention is not limited to the above embodiments, but various modifications and improvements can be made without departing from the scope of the invention. Moreover, the embodiments and modifications can be combined as long as they are not contradictory to each other.

For example, the substrate processing apparatus of the present invention can be applied not only to a capacitively coupled plasma (CCP: Capacitively Coupled Plasma) apparatus but also to other substrate processing apparatuses. The other substrate processing apparatus may be an inductively coupled plasma (ICP: Inductively Coupled Plasma) apparatus, a CVD (Chemical Vapor Deposition) apparatus using a radial line slot antenna, a helicon wave excited plasma (HWP: Helicon Wave Plasma) apparatus, an electron cyclotron resonance plasma (ECR: Electron Cyclotron Resonance Plasma) apparatus and the like.

A substrate to be processed by the substrate processing apparatus of the present invention may be a wafer, a large substrate for a flat panel display (Flat Panel Display), a substrate for an EL device or a solar cell.

The present application is based on and claims the benefit of priority of Japanese Patent Application No. 2014-104206 filed on May 20, 2014, and Japanese Patent Application No. 2015-087044 filed on Apr. 21, 2015, the entire contents of which are herein incorporated by reference.

DESCRIPTION OF THE REFERENCE NUMERALS 1 substrate processing apparatus
50 upper electrode
100 lower electrode
200 control part
205 CPU
210 HDD
215 ROM
220 ROM
C chamber

The invention claimed is:

1. A substrate processing apparatus comprising:
a chamber;
a control part configured to control a substrate process in accordance with a processing procedure set in a process recipe,
wherein the process recipe is linked to a plurality of partial recipes obtained by dividing the processing procedure into functions,
wherein the control part controls the substrate process in accordance with processing procedures set in the linked plurality of partial recipes,
wherein the plurality of partial recipes contains a partial recipe setting a processing procedure unique to the substrate process and a partial recipe setting a processing procedure common to the substrate process, and
wherein the partial processing recipe setting the unique processing procedure contains a plurality of partial recipes each setting a processing procedure of each process of a plurality of processes obtained by dividing the processing procedure unique to the substrate process thereinto, and the plurality of partial recipes are used to process different types of processing objects in the same chamber, all parameters of the plurality of partial recipes being preset fixed values.

2. The substrate processing apparatus as claimed in claim 1, wherein the partial recipe setting the common processing procedure contains a partial recipe setting at least any of processing procedures of a preceding process and a post-process of the process performed by the unique processing procedure.

3. The substrate processing apparatus as claimed in claim 1,
wherein the process recipe is linked to a macro program, and
wherein the control part controls the substrate process in accordance with a sequence determined by the linked macro program.

4. The substrate processing apparatus as claimed in claim 1,
wherein the process recipe is linked to a checking program, and
wherein the control part checks a state of the substrate processing apparatus in accordance with the linked checking program.

5. The substrate processing apparatus as claimed in claim 1, wherein the control part controls whether or not editing is authorized on a screen of the process recipe and the plurality of partial recipes based on first authority information showing an authority to edit each of the process recipe and the plurality of partial recipes.

6. The substrate processing apparatus as claimed in claim 1, wherein the control part controls whether or not reference is authorized on a screen of the process recipe and the plurality of partial recipes based on second authority information showing an authority to refer to each of the process recipe and the plurality of partial recipes.

7. A substrate processing method to process a substrate in accordance with a process recipe setting a processing procedure of the substrate, the method comprising:
creating a process recipe linked to a plurality of partial recipes obtained by dividing the processing procedure into functions and being unitized; and
processing the substrate in accordance with processing procedures set in the plurality of partial recipes linked to the process recipe,
wherein the plurality of partial recipes contains a partial recipe setting a processing procedure unique to the substrate process and a partial recipe setting a processing procedure common to the substrate process, and
wherein the partial processing recipe setting the unique processing procedure contains a plurality of partial recipes each setting a processing procedure of each process of a plurality of processes obtained by dividing the processing procedure unique to the substrate process thereinto, and the plurality of partial recipes are used to process different types of processing objects in the same chamber, all parameters of the plurality of partial recipes being preset fixed values.

8. A substrate processing program to process a substrate in accordance with a process recipe setting a processing procedure of the substrate, comprising:
a process of creating a process recipe linked to a plurality of partial recipes obtained by dividing the processing procedure into functions and being unitized; and
a process of processing the substrate in accordance with processing procedures set in the plurality of partial recipes linked to the process recipe,
wherein the plurality of partial recipes contains a partial recipe setting a processing procedure unique to the substrate process and a partial recipe setting a processing procedure common to the substrate process, and
wherein the partial processing recipe setting the unique processing procedure contains a plurality of partial recipes each setting a processing procedure of each process of a plurality of processes obtained by dividing the processing procedure unique to the substrate process thereinto, and the plurality of partial recipes are used to process different types of processing objects in the same chamber, all parameters of the plurality of partial recipes being preset fixed values.

* * * * *